United States Patent [19]
Harper et al.

[11] Patent Number: 5,418,188
[45] Date of Patent: May 23, 1995

[54] METHOD FOR CONTROLLED POSITIONING OF A COMPOUND LAYER IN A MULTILAYER DEVICE

[75] Inventors: James M. E. Harper, Yorktown Heights, N.Y.; Dan Moy, Bethel, Conn.; Shahrnaz Motakef, Tucson, Ariz.

[73] Assignee: International Business Machines Corporation, Armonk, N.Y.

[21] Appl. No.: 755,471

[22] Filed: Sep. 5, 1991

[51] Int. Cl.6 .................. H01L 21/441; H01L 21/302
[52] U.S. Cl. ........................... 437/200; 437/225; 437/247; 204/192.37
[58] Field of Search ............ 437/247, 225, 200; 148/DIG. 158, DIG. 51; 204/192.37, 192.34

[56] References Cited

U.S. PATENT DOCUMENTS

| | | | |
|---|---|---|---|
| 4,248,688 | 2/1981 | Gartner et al. | 204/192 |
| 4,608,118 | 8/1986 | Curtis et al. | 156/643 |
| 4,692,348 | 9/1987 | Rubloff et al. | 437/247 |
| 4,778,563 | 10/1988 | Stone | 156/643 |
| 4,851,257 | 7/1989 | Young et al. | 427/96 |
| 4,983,547 | 1/1991 | Arima et al. | 437/246 |

OTHER PUBLICATIONS

J. Fine, T. S. Andreadis and F. Davarya, Nucl. Instr. and Methods 209, 521 (1983) (no month).
M. Shikata and R. Shimizu Surf. Sci. 97, L363 (1980) (no month).
Th. Wirth, V. Atzrodt and H. Lange, phys. stat. sol. (a) 82, 459 (1984) (no month).
K. Morita, H. Ohno, M. Hayashibara and N. Itoh, Nucl. Instr. and Methods in Phys. Res. B2, 596 (1984) (no month).

Primary Examiner—John S. Maples
Attorney, Agent, or Firm—Heslin & Rothenberg

[57] ABSTRACT

A method for controlled positioning of a compound layer such as $TiSi_2$ or $CoSi_2$ in a multilayer device such as a semiconductor is disclosed. The compound surface layer is situated adjacent to an intermediate layer comprised of one of the two types of atoms present in the molecules of the adjacent compound surface layer. The intermediate layer is also situated adjacent to a base layer, such as a semiconductor substrate. An epitaxial silicon layer is the suggested intermediate layer where the surface layer is comprised of $TiSi_2$ or $CoSi_2$. By simultaneously heating the multilayer device and using an appropriate etching process for selectively removing the atoms from the surface of the compound surface layer which are common in both the compound and intermediate layer (i.e., silicon) the intermediate layer can be reduced in thickness and/or fully consumed while the structural integrity of the compound surface layer remains essentially unchanged. This results in positioning the surface layer directly adjacent to the base layer, thus allowing for the controlled placement of the compound layer in the multilayer device.

24 Claims, 6 Drawing Sheets (500-700 C)

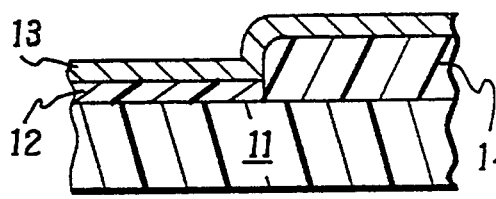
fig. 1
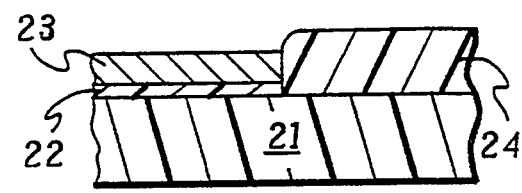
fig. 2
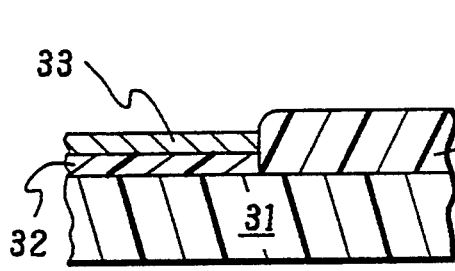
fig. 3
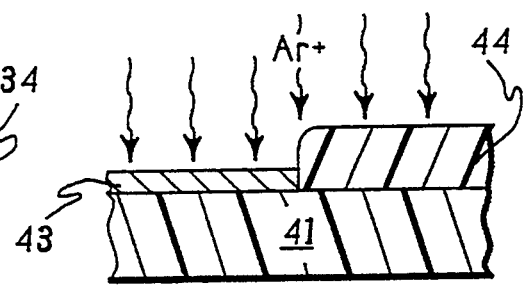
fig. 4
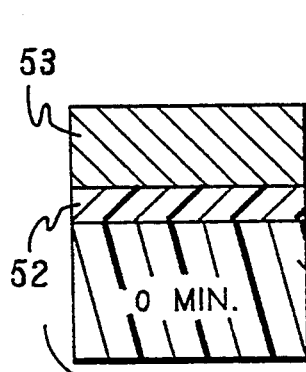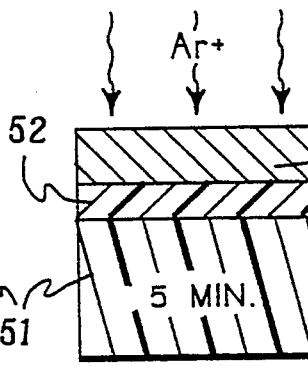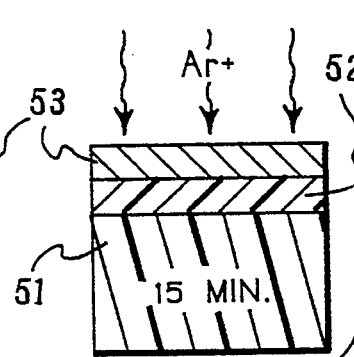
fig. 5 (< 400 C)
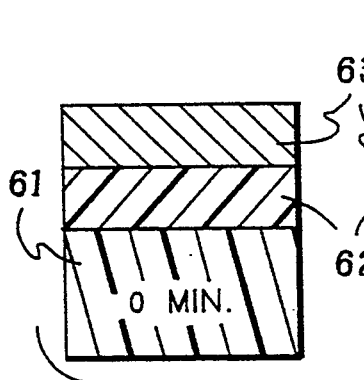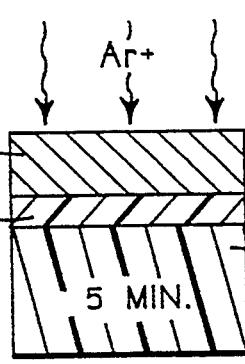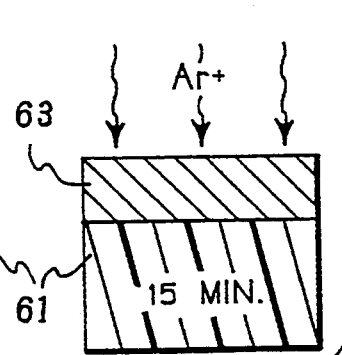
fig. 6 (500-700 C)

METHOD FOR CONTROLLED POSITIONING OF A COMPOUND LAYER IN A MULTILAYER DEVICE

BACKGROUND OF THE INVENTION

1. Field of the Invention

The present invention relates generally to multilayer film technology and more specifically to semiconductor technology. Most particularly, the present invention relates to the controlled positioning of a compound layer, such as a silicide layer, in relation to a semiconductor substrate, such as silicon. Such layers are typically used in fabricating complementary metal-oxide semiconductors (CMOS) transistors.

2. Background of Prior Art

It is well known by those skilled in the art that the electrical contact between a compound layer or film, such as a silicide and the silicon substrate in a semiconductor device is critical for good conductivity. Therefore, better contact between the compound layer and the substrate is always desired.

Problems with this contact region have been found when the semiconductor substrate contains various dopants which are generally added to improve the conductivity of the substrate. Contact metallurgists have discovered that when attempting to create a titanium silicide ($TiSi_2$) compound layer adjacent to and in contact with the semiconductor substrate, the semiconductor substrate frequently deteriorates because of the required high temperature annealing process used to convert the titanium silicide to a more conductive crystalline form, such as C-54 titanium silicide. The high temperature anneal often causes the dopants already present in the semiconductor substrate to redistribute and, further, creates a roughening of the contact region between the doped semiconductor and the adjacent silicide layer. This roughening can cause the device to short circuit.

Another difficulty in positioning titanium directly on a silicon semiconductor substrate is found with the complication in forming a uniformly thin titanium silicide layer in close proximity to device junctions. Silicide thicknesses of less than 50 nanometers must be carefully positioned very close to the device junctions to prevent leakage or shorting. The precise positioning of such a thin layer is often difficult.

Yet another shortcoming with the known technology occurs because the doped silicon frequently chosen for the semiconductor substrate layer is much less reactive with titanium than undoped silicon making the formation of a titanium silicide layer more difficult with doped silicon. Thus, it is more preferable to grow a titanium silicide layer on a layer of pure or lightly doped silicon than directly on the doped silicon.

For these reasons, in some devices, a selective silicon epitaxial layer is grown adjacent to the semiconductor doped silicon layer. Since this epitaxial silicon layer, commonly referred to as epi-silicon, is usually undoped or only lightly doped, it reacts better with the titanium to form a titanium silicide compound surface layer. However, after reacting the titanium with the epi-silicon layer, portions of the epi-silicon layer usually remain since it is difficult to control the exact thickness of the epi-silicon needed to react with the metal. Because of its undoped form, the remaining epi-silicon layer generally degrades the desired contact between the titanium silicide and the underlying semiconductor substrate. This contact resistance caused by the epi-silicon layer renders the semiconductor device less conductive.

The present invention provides for a method of removing the intermediate epitaxial silicon layer without destruction or disturbance to the newly formed compound surface layer. Removal of the epi-silicon layer also positions the surface layer immediately adjacent to the silicon semiconductor substrate, thus further improving the contact region.

The present invention essentially provides for a controlled method to reduce the thickness of the intermediate epitaxial silicon layer by selectively removing atoms which are of the same type as those atoms comprising the epitaxial layer from the surface of the compound silicide layer while simultaneously heating the multilayer device, such that the diffusion differential between the compound atoms provides for increased mobility of one of the two atoms relative to the other. Because of this diffusion differential, atoms from the intermediate epitaxial silicon layer replace the selectively removed silicon atoms until all atoms of the epitaxial silicon layer have effectively replaced the removed atoms and are incorporated into the compound molecules. The benefit of the inventive method is that the elimination of the intermediate layer causes the positioning of the compound surface layer to change while its structure remains essentially unchanged.

Arima, et al., U.S. Pat. No. 4,983,547, teaches the formation of a silicide film from a deposited film which contains a higher than stoichiometric concentration of silicon (silicon rich). A film of aluminum or aluminum alloy is deposited on the silicon rich film, followed by heat treatment to precipitate the excess silicon into the aluminum film, leaving a stoichiometric silicide. However, the reference fails to teach how to eliminate one layer while leaving an adjacent layer effectively or structurally intact.

Gartner, et al., U.S. Pat. No. 4,248,688, discloses the use of ion beam etching to selectively remove platinum or palladium in the presence of their silicides. The process relies on high sputter etching ratios between the metals and the silicides. However, the reference fails to introduce any possibility of moving the silicide layer closer to or relative to another layer, such as a silicon semiconductor substrate, nor is there a reference with regard to removing an intermediate layer through the selective removal process.

The diffusion of one constituent toward the surface has been shown to cause preferential sputtering in alloys of Ni—Ag and Cu—Ni and in compounds PtSi, $MoSi_2$ and NiSi requiring corrections to depth-profiling measurements of the composition. See for example J. Fine, T. D. Andreadis and F. Davarya, *Nucl. Instr. and Methods* 209/210 (1983) 521–530; M. Shikata and R. Shimizu, *Surf. Sci.*, 97 L363 (1980); and Th. Wirth, V. Atzrodt and H. Lange, *phys. stat. sol.* (a) 82, 459 (1984). In these cases, diffusion during ion etching establishes composition gradients up to several micrometers deep determined by temperature and preferential sputtering yields. Bilateral $Ni/Ni_3C$ has also been shown to develop highly preferential sputtering. K. Morita, H. Ohno, M. Hayashibara and N. Itoh, *Nucl. Instr. and Methods in Phys. Res.* B2 (1984) 596–600.

In general, there has been no teaching in the prior art of combining a method of mobilizing one of the types of atoms in a compound layer relative to the other and selectively removing atoms from the compound layer in order to eliminate an adjacent intermediate layer comprised of the same type of atoms as are being selectively removed from the adjacent layer, whereby the surface compound layer becomes positioned closer to a base layer through the controlled elimination of the intermediate layer, while the structure of the compound layer remains essentially unchanged.

SUMMARY OF THE INVENTION

The need for removing the epi-silicon layer subsequent to the formation of a titanium silicide or other compound intermediate surface layer adjacent thereto in order to vertically position said surface layer adjacent to a semiconductor substrate layer while maintaining the structural integrity of the surface layer is satisfied in accordance with the principles of the present invention by providing a method for controlled positioning of a surface compound layer comprising at least two types of atoms, one type being common-type atoms which type comprises an adjacent intermediate layer, which intermediate layer is adjacent to a base layer, and a second type of atoms. The steps of the method comprise heating said layers to a temperature at which one of said types of atoms in the compound surface layer is relatively more mobile than the other of said types of atoms in said layer; selectively removing common-type atoms from said surface layer such that the selectively removed common-type atoms are replaced by common-type atoms from the intermediate layer by diffusion; and controlling the selective removal of the common-type atoms from said surface layer to control the relative diffusion of atoms between said surface layer and said intermediate layer and thereby achieve a reduction of thickness the intermediate layer.

The invention further provides a method for controlling the position of a compound surface layer in a multilayer device comprising the steps of creating an intermediate layer directly adjacent to a base layer, said intermediate layer comprising a single type of atom; depositing or growing a surface layer directly adjacent to said intermediate layer, said surface layer comprising compound molecules wherein one of the atoms in said molecules is the same type or common-type as the atoms comprising the intermediate layer; and selectively removing common-type atoms from the compound surface layer and simultaneously heating said layers to a temperature which causes one type of atom in the compound molecules to be substantially more mobile than the other type of atom in said molecules; wherein the intermediate layer is reduced and compound surface layer is positioned closer to the base layer while its structural integrity is substantially unchanged.

It is a principal object of the invention to provide a method for the reduction or elimination of an intermediate layer which improves the conditions for formation of at least one layer of a multilayer, but which ultimately hinders the overall conductance of the semiconductor device.

It is also a principal object of the invention to improve a method for positioning a contact compound layer adjacent to and in good contact with the semiconductor substrate.

A principal advantage of the invention is that it provides a method of forming a multilayered semiconductor device with increased conductance by removing an undesirable intermediate layer originally desired for the formation of an adjacent surface layer.

A further advantage of the invention is that it provides for the controlled positioning of a compound surface layer adjacent with a base substrate layer by removal of the intermediate layer originally separating the surface layer and the base layer.

A still further advantage of the invention is to provide for a sharper, cleaner contact between the compound surface layer and the semiconductor substrate base layer.

A still further advantage of the inventive method is the ability to use a comparatively thick layer of epi-silicon as an intermediate layer with which a compound silicide surface layer is formed thereon, thereby making the formation of the compound layer easier and reducing the likelihood of a reaction between the metal and the doped semiconductor base layer.

A prime feature of the invention is the capability to remove the intermediate layer subsequent to the formation of the desired surface layer while maintaining the structural integrity of the newly formed surface layer and the underlying semiconductor substrate base layer.

BRIEF DESCRIPTION OF THE DRAWINGS

These and other objects, aspects, features and advantages of the present invention will be more readily understood from the following detailed description when read in conjunction with the accompanying drawings, in which:

FIG. 1 is a cross-sectional schematic view of a portion of a typical CMOS multilayered device.

FIG. 2 is a cross-sectional schematic view of a portion of a CMOS device of the type shown in FIG. 1 subsequent to the formation of a C-49 crystallized titanium silicide layer ($TiSi_2$).

FIG. 3 is a cross-sectional schematic view of a portion of a CMOS device of the type shown in FIG. 1 wherein the remaining epi-silicon layer (32) is comparatively thicker than in FIG. 2.

FIG. 4 is a cross-sectional schematic view of a portion of a typical CMOS device of the type shown in FIG. 3 subsequent to the steps of the inventive method.

FIG. 5 is a schematic view of the effects on a CMOS device of the type shown in FIG. 3 during $Ar^+$ ion bombardment at a temperature of less than 400° C. over time.

FIG. 6 is a schematic view of the effects on a CMOS device of the type shown in FIG. 3 during $Ar^+$ ion bombardment at a temperature of between 500° and 700° C. over time.

DETAILED DESCRIPTION OF THE PREFERRED EMBODIMENTS

Figure 7:
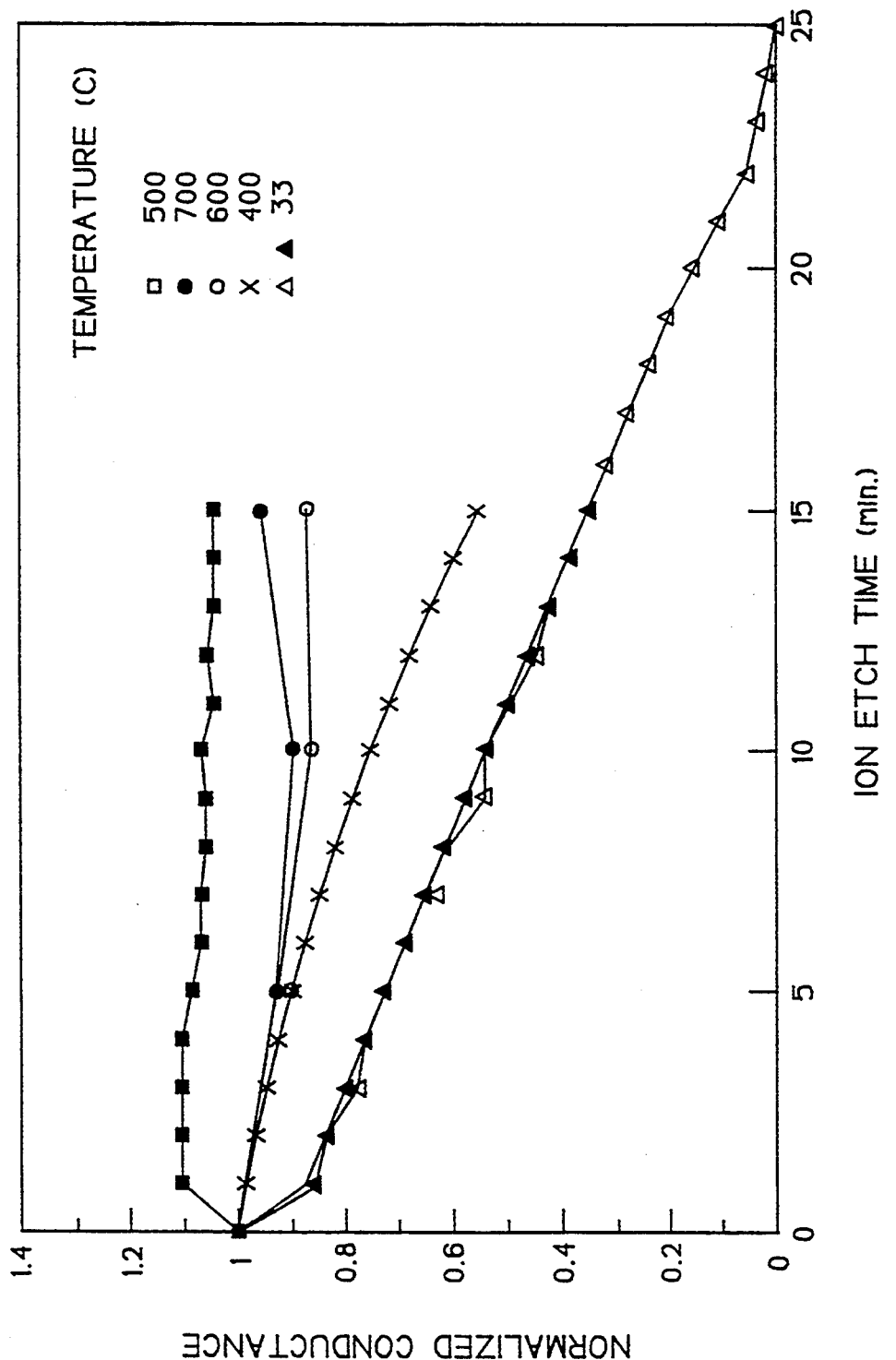
FIG. 7 is a graph showing the relationship between the conductance of a CMOS device having a titanium silicide surface layer and time during $Ar^+$ ion bombardment at various temperatures.

There will now be described a method for the controlled positioning of a compound layer in a multilayer device.

FIG. 1 shows an epi-silicon layer (12) sandwiched between a silicon substrate (11) and a titanium layer (13). An optional silicon dioxide insulating layer (14) is abutting and adjacent to the multilayers (11, 12, and 13).

FIG. 2 shows a C-49 crystallized titanium silicide layer ($TiSi_2$) (23) resulting from a typical annealing process wherein the titanium layer of FIG. 1 (13) is reacted with a portion of the epi-silicon layer of FIG. 1 (12). The unreacted titanium is selectively etched away using either an acid or base solution in the presence of an oxidizing agent as routinely done by those skilled in the art. There remains the unreacted portion of the epi-silicon layer (22).

FIG. 3 has a comparatively thicker epi-silicon layer (32) than in FIG. 1. The surface layers of $TiSi_2$ (33) has undergone the standard anneal process to form a C-49 crystalline structure.

FIG. 4 shows the CMOS device subsequent to the steps of the inventive method performed thereon wherein the C-49 $TiSi_2$ layer (43) is positioned adjacent to the silicon substrate (41) and the intermediate epi-silicon layer of FIG. 3 (32) has been fully consumed.

FIG. 5 shows a silicon substrate as a base layer (51), an epi-silicon intermediate layer (52), and a titanium silicide surface layer (53) during $Ar^+$ ion bombardment selective sputtering of the surface layer (53) at a temperature of less than 400° C. over time. The figure illustrates that the surface layer (53) is consumed and the intermediate layer (52) remains substantially intact.

FIG. 6 shows a silicon substrate base layer (61), an epi-silicon intermediate layer (62) and a titanium silicide surface layer (63) during the inventive process of ion bombardment selective sputtering of the surface layer (63) at a temperature of between 500° and 700° C. over time. FIG. 6 illustrates that the intermediate layer (62) is consumed over time while the surface layer (63) remains substantially intact.

In selecting the proper configuration for the multilayer device upon which the inventive method is best practiced, it is preferred to have an embodiment wherein there are at least three (3) contiguous layers such that the middle or intermediate layer is required to be present during the formation or creation of at least one of the other two adjacent layers, but wherein it is also desirable to eliminate or reduce the intermediate layer after such formation has occurred so that the layers immediately adjacent to the intermediate layer are positioned in direct contact with each other. Referring now to FIGS. 1, 2, and 3, the primary substrate (11, 21, and 31) is hereinafter referred to as the base layer, the middle layer (12, 22, and 32) is the intermediate layer and the layer adjacent to the remaining side of the intermediate layer is referred to as the surface layer (13, 23, and 33). The process of moving layers relative to each other is referred to as positioning and in the case of a stacked layered embodiment, as vertical positioning, regardless of the device's orientation.

It is equally important to select the proper composition for each layer. The base layer may be any compound compatible with the adjacent intermediate layer and which is ultimately compatible with the surface layer. In a CMOS or other semiconductor device, such a base layer is frequently a semiconductor substrate such as silicon and is frequently doped with N-type or P-type dopants for better conductivity.

The adjacent intermediate layer is comprising atoms which are desirable to be present throughout or during the formation of the surface layer. In particular, in semiconductor technology, it is frequently desirable to have a purely undoped or lightly doped silicon intermediate layer commonly known as epitaxial silicon or epi-silicon as the intermediate layer. The epi-silicon layer has good reactive qualities with titanium and other positive metals which react to form a silicide. For reasons stated above, direct reaction of the positive metal of a compound with a doped silicon base layer is less desirable.

Although epi-silicon is the preferred embodiment comprising the intermediate layer, germanium may also be used along with other compounds which react well with the positive atoms in the surface compound layer.

The surface layer is formed or grown by reaction with the intermediate layer so as to be positioned directly adjacent to the intermediate layer. The surface layer, once formed, is a compound layer having one of the types of atoms as is present or in common with the intermediate layer. Selection of a good compound is achieved by using compounds with a diffusion differential greater than about 10:1. Such compounds which qualify for good compound layer include, but are not limited to, titanium silicide ($TiSi_2$) or cobalt silicide ($CoSi_2$). Compounds made from Germanium would also be suitable. The formation of the surface layer is dependent on techniques used by those skilled in the art, such as a standard annealing process.

Once the structure and configuration of the multilayer CMOS device are selected, the multilayer device is heated to a temperature above 400° C. and preferably between about 500° C. and 700° C. with a temperature of about 600° C. being the most optimal. Simultaneously, the compound surface of the multilayered device is preferentially etched by bombarding the surface layer with argon ions generated by a relatively low ion energy source having a generation voltage of less than about 1,000 eV and preferably about 300 eV. Ion bombardment is used to achieve a selective scattering or sputtering from the top of the surface layer of those atoms which are in common with the intermediate layer referred to as common-type atoms.

Ion beams bombardment of the surface layer may be generated by a Kaufman ion source, a radio frequency plasma, a microwave (ECR) source, a plasma source, or by other generators known by those skilled in the art. Argon ions ($Ar^+$) have been used as suitable ions for the bombardment but other ions may be used for bombardment methods, such as, $Ne^+$, $Kr^+$, $Xe^+$. In place of ion bombardment scattering or sputtering methods, a chemical selective removal means may also be used, such as a reactive etching or plasma etching process. Conceivably, any selective removal process which can accomplish the required removal of selected atoms from the surface layer at the required temperature range could be substituted.

The selection of the temperature range and the etching or sputtering procedure is critical. In order to obtain a highly selective removal of common-type atoms from the surface layer, the temperature should be between about 500° C. and 700° C. Schematic FIG. 5 illustrates that where titanium silicide comprises the surface layer, temperatures of less than 400° C. result in the depletion of the surface layer (53) instead of the intermediate layer 52. FIG. 7 shows that at room temperature (33° C.) the conductance of the device reaches zero within twenty-five minutes of the commencement of the ion bombardment, which indicates the surface layer is fully consumed. Schematic FIG. 6 illustrates that where the Ar+ ion bombardment of the surface layer is conducted at a temperature of between about 500° and 700° C., the intermediate layer 62 is depleted and the surface layer 63 remains intact and is thereafter positioned adjacent to the base layer 61 thereby replacing the depleted intermediate layer 62.

EXAMPLE I

A titanium film of 100 nanometers is deposited on a layer of pure silicon (epi-silicon) which is situated adjacent to a doped silicon semiconductor substrate. The titanium deposit is reacted with a portion of the adjacent epi-silicon layer by annealing the sample at 675° C. for 30 minutes in nitrogen gas to form a 230 nanometer thick layer comprised essentially of C-49 crystalline $TiSi_2$. A standard selective chemical etch is conducted on the titanium silicide surface layer using an acid solution of sulfuric acid and peroxide as an oxidizing agent to remove the excess unreacted titanium. The sample is heated to 600° C. and, simultaneously, subjected to Ar+ ion bombardment at 300 eV with a flux of 0.2 $mA/cm^2$.

The mechanism believed responsible for the effectiveness of the present inventive method is a combination of the highly selectively removal of the atoms from the surface compound layer which are common to both the intermediate layer and the compound surface layer and either the ability of the remaining atoms in the surface layer to diffuse to and react with the atoms in the intermediate layer to reform the compound or the ability of the atoms in the intermediate layer to diffuse into the surface layer to react with the remaining atoms in the surface layer and, thereby, replace the atoms which are selectively removed to reform the compound molecules. The diffusion is accomplished by making the one type of atom more mobile than the other atom in the compound molecules.

In the case of a surface layer of cobalt silicide ($CoSi_2$) and an intermediate layer of epi-silicon, it is believed that the prior mechanism is operative, wherein the Co atoms are more mobile than the Si atoms and, thus, the Co atoms diffuse to react with the epi-silicon intermediate layer.

In the case of a titanium silicide ($TiSi_2$) surface layer and an epi-silicon intermediate layer, it is believed that the second mechanism controls wherein the Si atoms are more mobile than the Ti atoms and thus, the silicon atoms from the intermediate layer diffuse into the surface layer.

It is believed that at room temperature, preferential or selective sputtering alters the near surface composition of a compound to compensate for the preferential sputtering, such that the net composition removed corresponds to the bulk composition. At high temperatures, however, one species may be more mobile than the other. If the more mobile species has a higher sputtering yield, then it is continuously removed from the surface of the surface layer while being replaced by diffusion from the interior of the material.

The effectiveness of the inventive method over variations in temperature is illustrated in FIG. 7 wherein the optimal normalized conductance (shown by a value of 1) occurs with an ion beam etching process at 600° C. At and below 400° C. the conductance drastically reduces over time indicating that the surface layer of $TiSi_2$ is being etched away.

Figure 8:
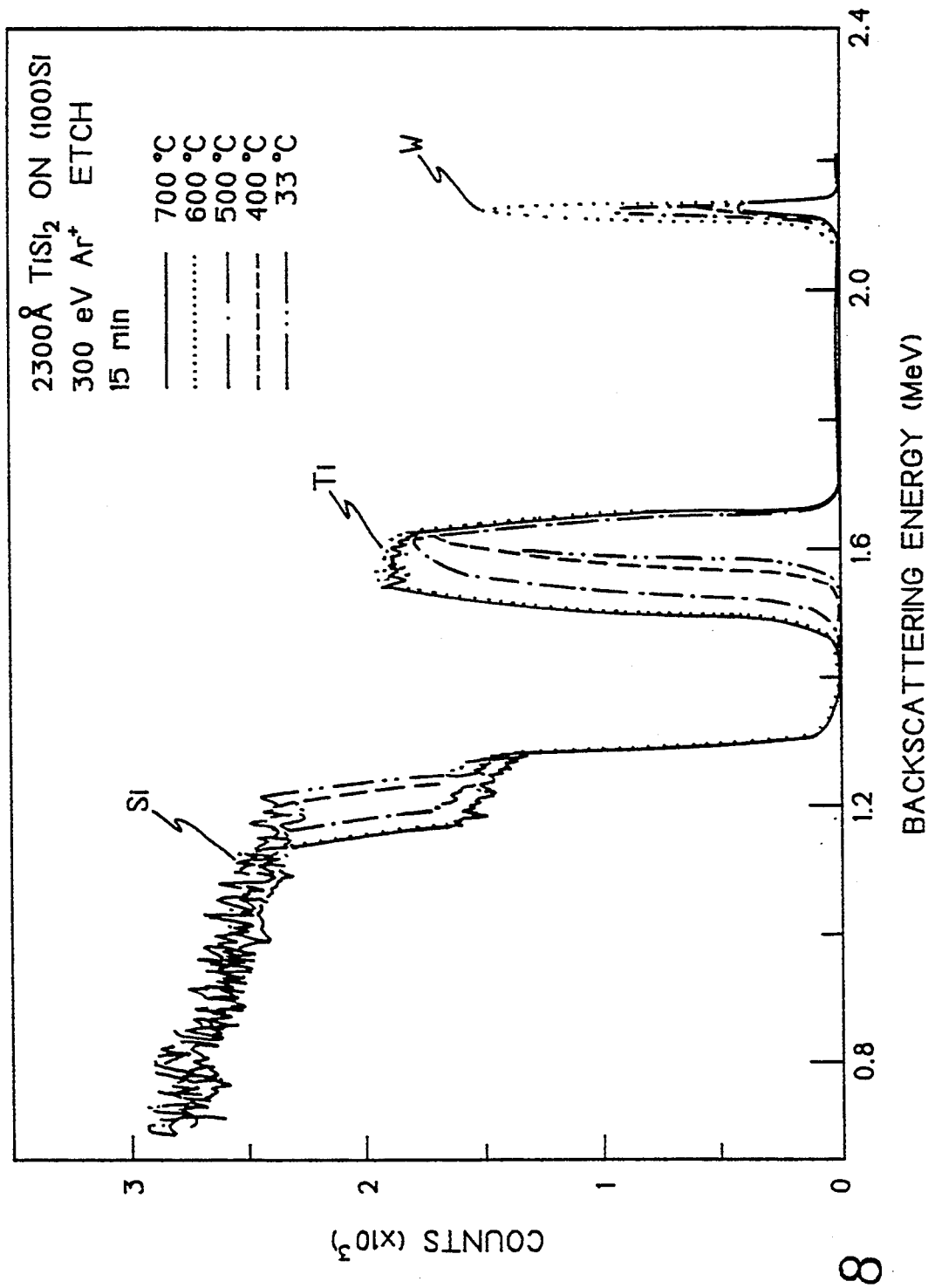
FIG. 8 is a graph showing the Rutherford Backscattering Spectra displaying the loss of titanium and silicon atoms during $Ar^+$ ion bombardment for 15 minutes at various temperatures.
Figure 9:
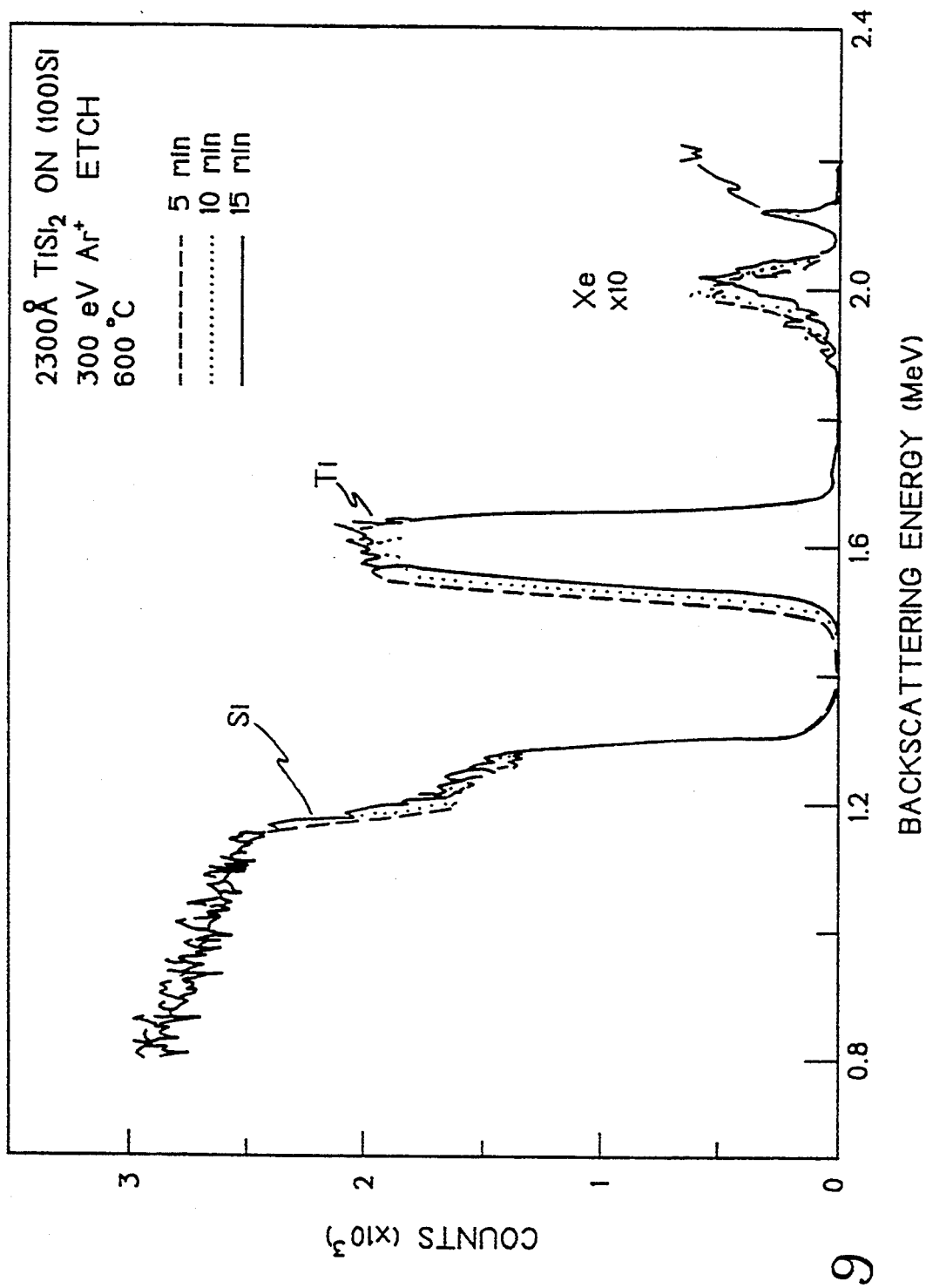
FIG. 9 shows the Rutherford Backscattering Spectra of a sample containing an implanted Xe marker showing that Si atoms move during an $Ar^+$ ion bombardment at 300 eV at 600° C.

FIG. 8 shows the Rutherford Backscattering Spectra of a bombarded sample for various temperatures. At 33° C. the titanium peak indicates that the titanium in the surface layer is being removed by sputtering. At 700° C. the spectra show that no titanium is removed. The tungsten (W) reading in the Rutherford Backscattering Spectra is caused from some contamination of the sample as a result of ion beams hitting the tungsten probes used to monitor sheet resistance during ion etching. FIG. 9 shows the Rutherford Backscattering Spectra for the sample in Example I above. In this sample, a Xe marker shows that the dominant moving species is Si and not Ti.

Figure 10:
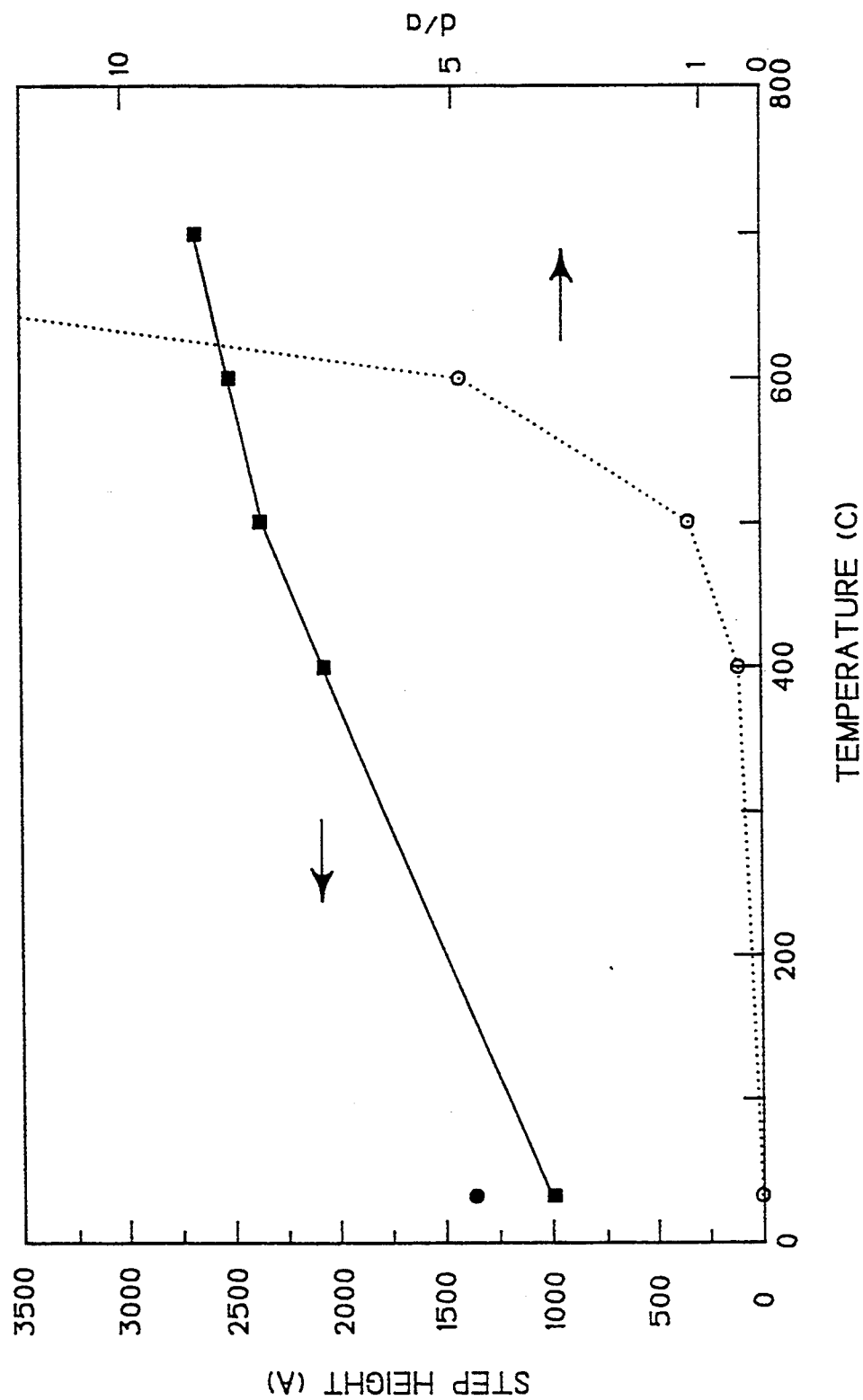
FIG. 10 is a graph showing the relationship between the step height measurements relative to adjacent masked areas during ion bombardment and various temperatures.

FIG. 10 shows the step height of the ion bombarded surface relative to adjacent masked areas during ion bombardment at various temperatures (solid line). The surface of the silicide is recessed over 2000 angstroms at temperatures above 500° C., while the Rutherford Backscattering spectra (FIG. 8) show that the thickness of the silicide remains substantially unchanged. The recess is believed to be due to the sputter removal of silicon which has diffused to the surface from beneath the silicide. The dotted line in FIG. 10 shows the ratio of the diffusion distance of Si atoms in 1 second (d) to the thickness of silicide sputtered from the surface in 1 second (a) as a function of temperature. The ratio d/a exceeds unity at about 500° C., indicating that at temperatures above 500° C., diffusion of Si is fast enough to replenish the Si atoms removed from the surface by sputtering, thereby allowing the composition of the silicide to remain unchanged.

Figure 11:
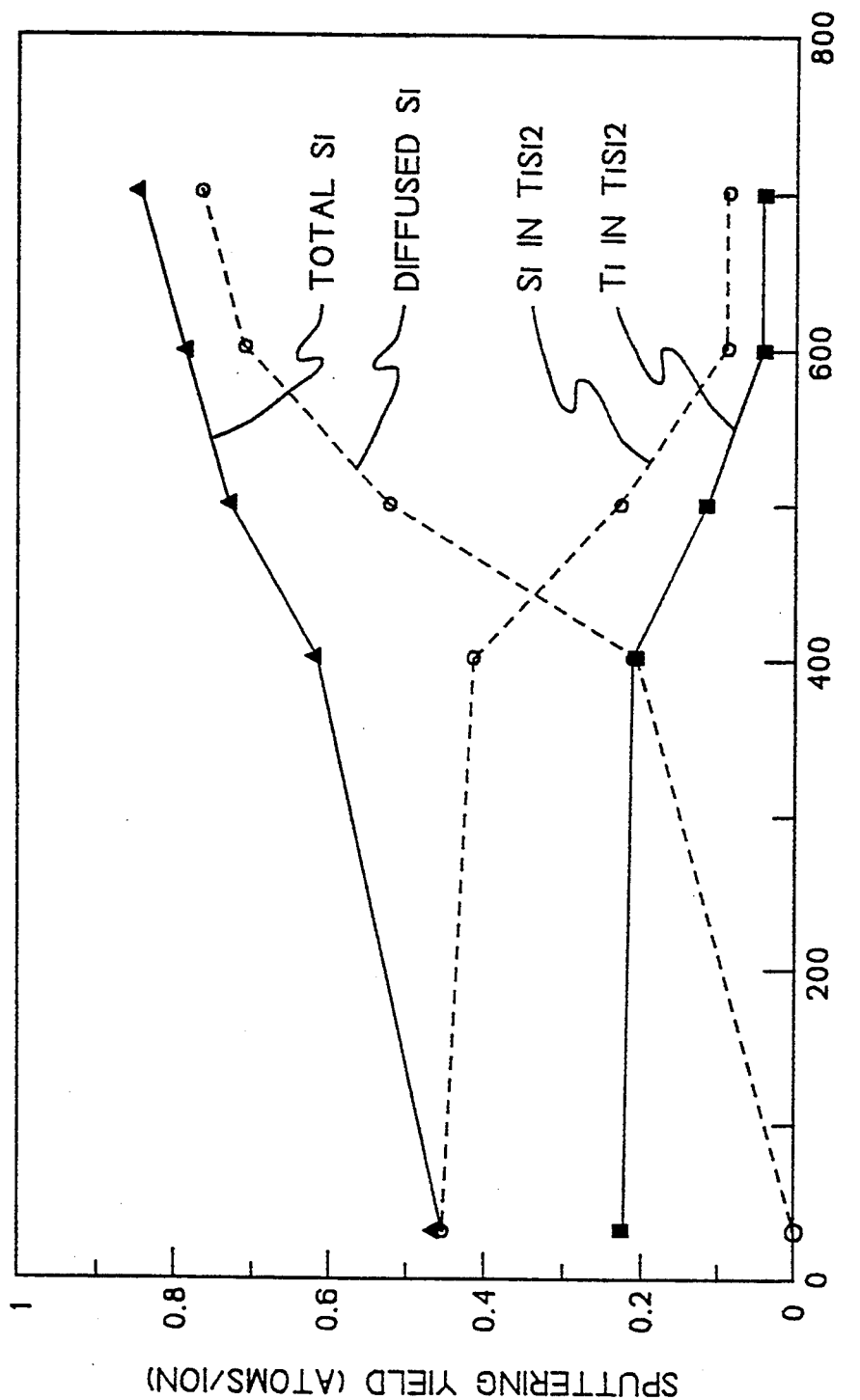
FIG. 11 shows the sputtering yield of a CMOS device of the type shown in FIG. 3 in atoms per ion during an ion beam bombardment over a temperature range from 0° C. to 700° C.

FIG. 11 shows the sputtering yield (number of atoms removed per incident argon ion) during ion bombardment over a temperature range from 0° C. to 700° C. The components of the sputtered atom flux are identified as Ti atoms from $TiSi_2$, Si atoms from $TiSi_2$, and Si atoms diffused from beneath the $TiSi_2$ layer. At temperatures above 500° C., the sputtered atom flux is almost entirely composed of Si atoms diffused to the surface from beneath the $TiSi_2$ layer.

Once a titanium silicide or cobalt silicide surface layer is positioned adjacent to a silicon substrate base layer because the intermediate epi-silicon layer is removed, the practitioner may desire to convert the C-49 titanium silicide surface structure to a C-54 titanium silicide structure to obtain optimum low resistance in the CMOS device. The conversion can be accomplished by a standard anneal used by those skilled in the art.

While the invention has been described in terms of the preferred embodiments, those skilled in the art will recognize that the specific configurations, steps and parameters may be varied in the practice of the invention by those skilled in the art without departing from the spirit of the invention, the scope of which is defined by the appended claims.

Having thus described our invention, what is claimed is:

1. A method for controlled positioning in a semiconductor device of a surface compound layer comprising silicide having at least two types of atoms, one type being common-type atoms which type comprises an adjacent intermediate layer, which intermediate layer is adjacent to a base layer, and a second type of atoms comprising the steps of:

heating said layers to a temperature at which one of said types of atoms in the compound surface layer is relatively more mobile than the other of said types of atoms in said layer;

selectively removing common-type atoms from said surface layer such that the selectively removed common-type atoms are replaced by common-type atoms from the intermediate layer by diffusion; and controlling the selective removal of the common-type atoms from said surface layer to control the relative diffusion of atoms between said surface layer and said intermediate layer, thereby reducing the thickness of the intermediate layer.

2. A method according to clam 1 wherein said intermediate layer is silicon or epitaxial silicon.

3. A method according to claim 2 wherein said silicide is titanium silicide or cobalt silicide.

4. A method according to claim 1 wherein said heating step comprises heating said layers to a temperature of between about 500° C. and 700° C.

5. A method according to claim 2 wherein said heating step comprises heating said layers to a temperature of between about 500° C. and 700° C.

6. A method according to claim 3 wherein said heating step comprises heating said layers to a temperature of between about 500° C. and 700° C.

7. A method according to claim 4 wherein said heating step comprises heating said layers to a temperature of about 600° C.

8. A method according to claim 5 wherein said heating step comprises heating said layers to a temperature of about 600° C.

9. A method according to claim 6 wherein said heating step comprises heating said layers to a temperature of about 600° C.

10. A method according to claim 1 wherein said selectively removing step comprises ion bombardment preferential etching or sputtering, or chemical ion etching or plasma etching.

11. A method according to claim 2 wherein said selectively removing step comprises ion bombardment preferential etching or sputtering, or chemical ion etching or plasma etching.

12. A method according to claim 3 wherein said selectively removing step comprises ion bombardment preferential etching or sputtering, or chemical ion etching or plasma etching.

13. A method for controlling the position of a compound surface layer comprising silicide in a multilayer semiconductor device comprising the steps of:

creating an intermediate layer directly adjacent to a base layer, said intermediate layer comprising a single type of atom;

depositing or growing a surface layer directly adjacent to said intermediate layer, said surface layer comprising compound molecules wherein one type of atoms in said molecules is the same type or common-type as the atoms comprising the intermediate layer; and selectively removing common-type atoms from the compound surface layer and simultaneously heating said layers to a temperature which causes one type of atoms in the compound molecules to be substantially more mobile than the other type of atoms in said molecules, wherein the thickness of the intermediate layer is reduced and the compound surface layer is positioned closer to the base layer while its structural integrity is substantially unchanged.

14. A method according to claim 13 wherein said intermediate layer is silicon or epitaxial silicon.

15. A method according to claim 13 wherein said silicide is titanium silicide or cobalt silicide.

16. A method according to claim 13 wherein said selectively removing step comprises preferential ion beam etching, or sputtering, or chemical reactive ion etching or plasma etching.

17. A method according to claim 14 wherein said selectively removing step comprises preferential ion beam etching, or sputtering, or chemical reactive ion etching or plasma etching.

18. A method according to claim 15 wherein said selectively removing step comprises preferential ion beam etching, or sputtering, or chemical reactive ion etching or plasma etching.

19. A method according to claim 13 wherein said heating step comprises heating said layers to a temperature of between about 500° C. and 700° C.

20. A method according to claim 14 wherein said heating step comprises heating said layers to a temperature of between about 500° C. and 700° C.

21. A method according to claim 15 wherein said heating step comprises heating said layers to a temperature of between about 500° C. and 700° C.

22. A method according to claim 19 wherein said heating step comprising heating the layers to a temperature of about 600° C.

23. A method according to claim 20 wherein said heating step comprising heating the layers to a temperature of about 600° C.

24. A method according to claim 21 wherein such heating step comprises heating said layers to a temperature of about 600° C.

* * * * *